(12) United States Patent
Melanson et al.

(10) Patent No.: US 10,090,814 B2
(45) Date of Patent: Oct. 2, 2018

(54) REMOVAL OF SWITCHING DISCONTINUITY IN A HYBRID SWITCHED MODE AMPLIFIER

(71) Applicant: Cirrus Logic International Semiconductor Ltd., Edinburgh (GB)

(72) Inventors: John L. Melanson, Austin, TX (US); Eric J. King, Dripping Springs, TX (US); Zhaohui He, Austin, TX (US); Siddharth Maru, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/270,687

(22) Filed: Sep. 20, 2016

(65) Prior Publication Data
US 2017/0272044 A1 Sep. 21, 2017

Related U.S. Application Data

(60) Provisional application No. 62/309,068, filed on Mar. 16, 2016.

(51) Int. Cl.
| | | |
|---|---|---|
| *H03F 3/217* | (2006.01) | |
| *H03F 3/187* | (2006.01) | |
| *H04R 3/02* | (2006.01) | |

(52) U.S. Cl.
CPC ........... *H03F 3/2173* (2013.01); *H03F 3/187* (2013.01); *H04R 3/02* (2013.01);
(Continued)

(58) Field of Classification Search
USPC ................ 330/251, 10, 207 A, 297
See application file for complete search history.

(56) References Cited

U.S. PATENT DOCUMENTS 3,851,269 A    11/1974  Szorc
5,963,101 A    10/1999  Iravani
(Continued)

FOREIGN PATENT DOCUMENTS

EP    1367704 A2    12/2003
GB    2510395 A     8/2014
(Continued)

OTHER PUBLICATIONS

International Search Report and Written Opinion of the International Searching Authority, International Patent Application No. PCT/US2016/040072, dated Sep. 16, 2016.
(Continued)

*Primary Examiner* — Hieu Nguyen
(74) *Attorney, Agent, or Firm* — Jackson Walker L.L.P.

(57) ABSTRACT

A signal processing system for producing a load voltage at a load output of the signal processing system, wherein the load output comprises a first load terminal having a first load voltage and a second load terminal having a second load voltage such that the load voltage comprises a difference between the first load voltage and the second load voltage, and may include a first processing path configured to process a first signal derived from an input signal to generate the first load voltage at a first processing path output, a second processing path configured to process a second signal received at a second processing path input and derived from the input signal, wherein the second signal comprises information of the input signal absent from the first signal, to generate the second load voltage at a second processing path output, and a high-pass filter coupled between the first processing path output and the second processing path input.

16 Claims, 4 Drawing Sheets

(52) U.S. Cl.
CPC .. *H03F 2200/165* (2013.01); *H03F 2200/432* (2013.01); *H04R 2420/03* (2013.01)

(56) References Cited

U.S. PATENT DOCUMENTS

| | | | |
|---|---|---|---|
| 6,348,781 | B1 | 2/2002 | Midya et al. |
| 6,617,908 | B1 | 9/2003 | Thomsen et al. |
| 6,727,752 | B2 | 4/2004 | Skinner et al. |
| 7,084,799 | B1 * | 8/2006 | Butler .................. H03F 3/2175 341/143 |
| 7,265,524 | B2 | 9/2007 | Jordan et al. |
| 7,466,194 | B2 | 12/2008 | Mazda et al. |
| 8,242,847 | B1 | 8/2012 | Leong et al. |
| 8,638,168 | B1 | 1/2014 | Signoff et al. |
| 8,773,196 | B2 | 7/2014 | Delano |
| 9,088,211 | B2 | 7/2015 | Ivanov et al. |
| 9,628,033 | B2 | 4/2017 | King et al. |
| 9,647,611 | B1 | 5/2017 | Embar et al. |
| 2003/0122615 | A1 | 7/2003 | Zeff |
| 2003/0222713 | A1 | 12/2003 | Skinner et al. |
| 2004/0169552 | A1 | 9/2004 | Butler |
| 2005/0013447 | A1 | 1/2005 | Crump et al. |
| 2005/0083115 | A1 | 4/2005 | Risbo |
| 2007/0229332 | A1 | 10/2007 | Tsividis |
| 2008/0111622 | A1 | 5/2008 | Sperlich et al. |
| 2008/0310046 | A1 | 12/2008 | Menegoli et al. |
| 2009/0027247 | A1 | 1/2009 | Kumamoto et al. |
| 2009/0212859 | A1 | 8/2009 | Lesso et al. |
| 2010/0214024 | A1 | 8/2010 | Jones et al. |
| 2010/0237941 | A1 | 9/2010 | Goldfarb et al. |
| 2012/0306575 | A1 | 12/2012 | Shah et al. |
| 2014/0028395 | A1 | 1/2014 | Chan et al. |
| 2014/0247035 | A1 | 9/2014 | Gupta et al. |
| 2015/0071464 | A1 | 3/2015 | Du et al. |
| 2015/0097541 | A1 | 4/2015 | Banag |
| 2015/0222184 | A1 | 8/2015 | Melanson et al. |
| 2015/0323947 | A1 | 11/2015 | Amadi et al. |
| 2016/0056707 | A1 | 2/2016 | Wong et al. |
| 2017/0207755 | A1 | 7/2017 | He et al. |
| 2017/0207759 | A1 | 7/2017 | He et al. |
| 2017/0271996 | A1 | 9/2017 | King et al. |
| 2017/0272043 | A1 | 9/2017 | King et al. |
| 2017/0272044 | A1 | 9/2017 | Melanson et al. |

FOREIGN PATENT DOCUMENTS

| | | |
|---|---|---|
| GB | 2546576 A | 7/2017 |
| JP | S59224905 A | 12/1984 |
| WO | 98/57422 A1 | 12/1998 |
| WO | 2007136800 A2 | 11/2007 |
| WO | 2017127132 A1 | 7/2017 |
| WO | 2017127353 A1 | 7/2017 |
| WO | 2017160520 A1 | 9/2017 |
| WO | 2017160522 A1 | 9/2017 |
| WO | 2017160556 A1 | 9/2017 |

OTHER PUBLICATIONS

Combined Search Report and Written Opinion, GB Application No. 1617096.1, dated Apr. 7, 2017.
Search Report, GB Application No. 1619679.2, dated Apr. 28, 2017.
International Search Report and Written Opinion of the International Searching Authority, International Patent Application No. PCT/US2017/020927, dated May 26, 2017.
International Search Report and Written Opinion of the International Searching Authority, International Patent Application No. PCT/US2017/021351, dated May 26, 2017.
International Search Report and Written Opinion of the International Searching Authority, International Patent Application No. PCT/US2017/013756, dated May 30, 2017.
Eynde, Frank O. On the relationship between the CMRR or PSRR and the second harmonic distortion of differential input amplifiers, IEEE Journal of Solid-State Circuits, vol. 24, Issue: 6, Dec. 1989, pp. 1740-1744.
Combined Search and Examination Report under Sections 17 and 18(3) of the UKIPO, Application No. GB1701269.1, dated Jul. 7, 2017.
Combined Search and Examination Report under Sections 17 and 18(3) of the UKIPO, Application No. GB1703492.7, dated Aug. 31, 2017.
Combined Search and Examination Report under Sections 17 and 18(3) of the UKIPO, Application No. GB1703865.4, dated Aug. 31, 2017.
International Search Report and Written Opinion of the International Searching Authority, International Application No. PCT/US2017/020911, dated Nov. 7, 2017.

* cited by examiner

REMOVAL OF SWITCHING DISCONTINUITY IN A HYBRID SWITCHED MODE AMPLIFIER

FIELD OF DISCLOSURE

The present disclosure relates in general to circuits for audio devices, including without limitation personal audio devices such as wireless telephones and media players, and more specifically, to a switched mode amplifier including a switched mode converter for driving an audio transducer of an audio device.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a speaker driver including a power amplifier for driving an audio output signal to headphones or speakers.

SUMMARY

In accordance with the teachings of the present disclosure, one or more disadvantages and problems associated with existing approaches to driving an audio output signal to an audio transducer may be reduced or eliminated.

In accordance with embodiments of the present disclosure, a signal processing system for producing a load voltage at a load output of the switching power stage, the load output comprising a first load terminal having a first load voltage and a second load terminal having a second load voltage such that the load voltage comprises a difference between the first load voltage and the second load voltage, may include a first processing path configured to process a first signal derived from an input signal to generate a first path voltage at a first processing path output, a second processing path configured to process a second signal received at a second processing path input and derived from the input signal to generate a second path voltage at a second processing path output, a first switching full-bridge, a capacitor having a first capacitor terminal and a second capacitor terminal, a second switching full-bridge, and a controller. The first switching full-bridge may include a first plurality of switches comprising at least a first switch coupled between the first processing path output and the first load terminal and a second switch coupled between the first processing path output and the second load terminal and a second plurality of switches comprising at least a third switch coupled between the second processing path output and the first load terminal and a fourth switch coupled between the second processing path output and the second load terminal. The second switching full-bridge may include a third plurality of switches comprising at least a fifth switch coupled between the first processing path output and the first capacitor terminal and a sixth switch coupled between the first processing path output and the second capacitor terminal and a fourth plurality of switches comprising at least a seventh switch coupled between the second processing path input and the first capacitor terminal and an eighth switch coupled between the second processing path input and the second capacitor terminal. The controller may be configured to control switches of the first switching full-bridge in order to generate the load voltage as a function of the input signal and control switches of the second switching full-bridge such that when switches of the first switching full-bridge are switched to reverse connectivity of the first processing path and the second processing path to the first load terminal and the second load terminal, switches of the second switching full-bridge are switched substantially contemporaneously with switching of the switches of the first switching full-bridge to reverse connectivity of the first processing path and the second processing path to the first capacitor terminal and the second capacitor terminal and minimize voltage discontinuities caused by the switching of the switches of the first switching full-bridge.

In accordance with these and other embodiments of the present disclosure, a method for producing a load voltage at a load output of a signal processing system, the load output comprising a first load terminal having a first load voltage and a second load terminal having a second load voltage such that the load voltage comprises a difference between the first load voltage and the second load voltage, wherein the switching power stage comprises a first processing path configured to process a first signal derived from an input signal to generate a first path voltage at a first processing path output, a second processing path configured to process a second signal received at a second processing path input and derived from the input signal to generate a second path voltage at a second processing path output, a first switching full-bridge comprising a first plurality of switches comprising at least a first switch coupled between the first processing path output and the first load terminal and a second switch coupled between the first processing path output and the second load terminal and a second plurality of switches comprising at least a third switch coupled between the second processing path output and the first load terminal and a fourth switch coupled between the second processing path output and the second load terminal, a capacitor having a first capacitor terminal and a second capacitor terminal, a second switching full-bridge including a third plurality of switches comprising at least a fifth switch coupled between the first processing path output and the first capacitor terminal and a sixth switch coupled between the first processing path output and the second capacitor terminal and a fourth plurality of switches comprising at least a seventh switch coupled between the second processing path input and the first capacitor terminal and an eighth switch coupled between the second processing path input and the second capacitor terminal, wherein the method comprises controlling switches of the first switching full-bridge in order to generate the load voltage as a function of the input signal and controlling switches of the second switching full-bridge such that when switches of the first switching full-bridge are switched to reverse connectivity of the first processing path and the second processing path to the first load terminal and the second load terminal, switches of the second switching full-bridge are switched substantially contemporaneously with switching of the switches of the first switching full-bridge to reverse connectivity of the first processing path and the second processing path to the first capacitor terminal and the second capacitor terminal and minimize voltage discontinuities caused by the switching of the switches of the first switching full-bridge.

In accordance with these and other embodiments of the present disclosure, a signal processing system for producing a load voltage at a load output of the signal processing system, wherein the load output comprises a first load terminal having a first load voltage and a second load terminal having a second load voltage such that the load voltage comprises a difference between the first load voltage and the second load voltage, may include a first processing path configured to process a first signal derived from an input signal to generate the first load voltage at a first processing path output, a second processing path configured to process a second signal received at a second processing path input and derived from the input signal, wherein the second signal comprises information of the input signal absent from the first signal, to generate the second load voltage at a second processing path output, and a high-pass filter coupled between the first processing path output and the second processing path input.

In accordance with these and other embodiments of the present disclosure, a method for producing a load voltage at a load output of a signal processing system, the load output comprising a first load terminal having a first load voltage and a second load terminal having a second load voltage such that the load voltage comprises a difference between the first load voltage and the second load voltage, may include processing a first signal derived from an input signal to generate the first load voltage at a first processing path output, processing a second signal received at a second processing path input and derived from the input signal, wherein the second signal comprises information of the input signal absent from the first signal, to generate the second load voltage at a second processing path output, and high-pass filtering the first load voltage and combining a resulting of the high-pass filtering with the second signal.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
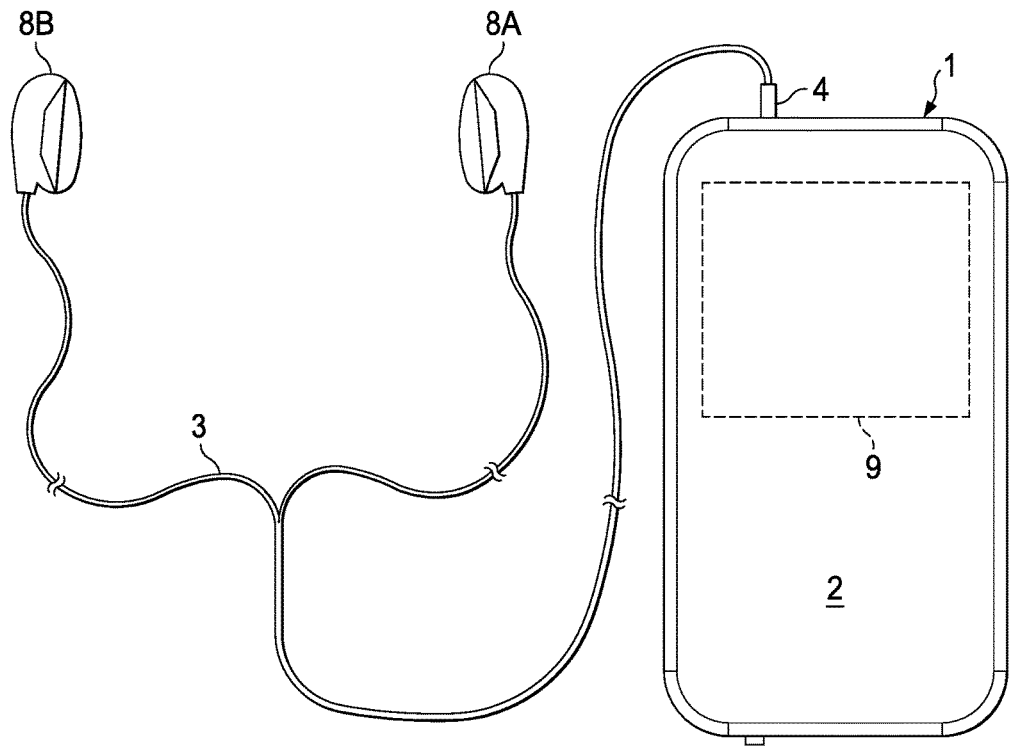
FIG. 1 illustrates an example personal audio device, in accordance with embodiments of the present disclosure.

FIG. 1 illustrates an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
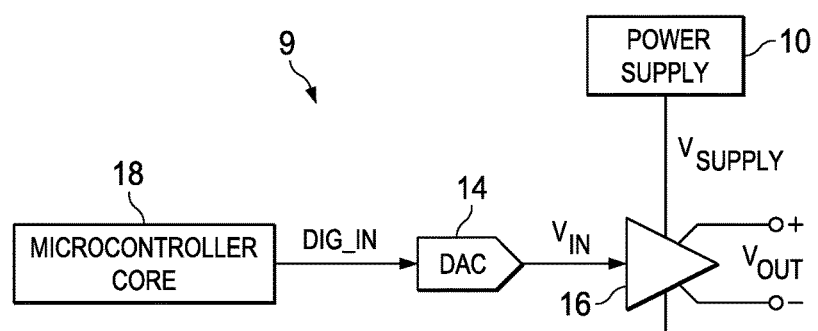
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. As shown in FIG. 2, a microcontroller core 18 may supply a digital audio input signal DIG_IN to a digital-to-analog converter (DAC) 14, which may convert the digital audio input signal to an analog signal $V_{IN}$. DAC 14 may supply analog signal $V_{IN}$ to an amplifier 16 which may amplify or attenuate audio input signal $V_{IN}$ to provide a differential audio output signal $V_{OUT}$, which may operate a speaker, a headphone transducer, a line level signal output, and/or other suitable output. In some embodiments, DAC 14 may be an integral component of amplifier 16. A power supply 10 may provide the power supply rail inputs of amplifier 16. In some embodiments, power supply 10 may comprise a battery. Although FIGS. 1 and 2 contemplate that audio IC 9 resides in a personal audio device, systems and methods described herein may also be applied to electrical and electronic systems and devices other than a personal audio device, including audio systems for use in a computing device larger than a personal audio device, an automobile, a building, or other structure.

Figure 3:
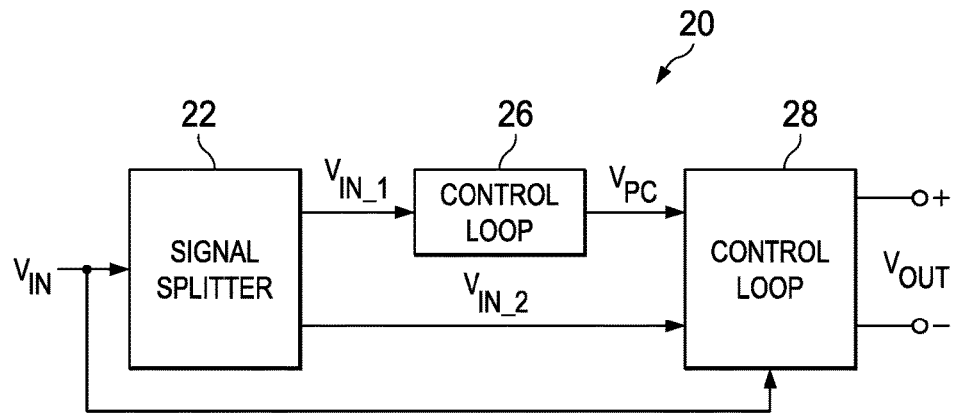
FIG. 3 illustrates a block and circuit diagram of selected components of an example switched mode amplifier, in accordance with embodiments of the present disclosure.

FIG. 3 illustrates a block and circuit diagram of selected components of an example switched mode amplifier 20, in accordance with embodiments of the present disclosure. In some embodiments, switched mode amplifier 20 may implement all or a portion of amplifier 16 described with respect to FIG. 2. As shown in FIG. 3, switched mode amplifier 20 may comprise a signal splitter 22, a first control loop 26, and a second control loop 28.

Signal splitter 22 may comprise any system, device, or apparatus configured to receive audio input signal $V_{IN}$ (or a derivative thereof) and generate a first signal $V_{IN\_1}$ derived from audio input signal $V_{IN}$ and generate a second signal $V_{IN\_2}$, derived from audio input signal $V_{IN}$, wherein second signal $V_{IN\_2}$ comprises information of the input signal absent from first signal $V_{IN\_1}$ (e.g., $V_{IN\_2}=V_{IN}-V_{IN\_1}$). For example, in some embodiments, first signal $V_{IN\_1}$ and second signal $V_{IN\_2}$ may be governed by the following set of equations:

$$V_{IN\_1}=V_{IN}; \text{ for } |V_{IN}|>V_{SAT\_IN}$$

$$V_{IN\_1}=V_{SAT\_IN}; \text{ for } |V_{IN}|\leq V_{SAT\_IN}$$

$$V_{IN\_2}=0; \text{ for } |V_{IN}|>V_{SAT\_IN}$$

$$V_{IN\_2}=V_{SAT\_IN}-V_{IN}; \text{ for } |V_{IN}|\leq V_{SAT\_IN}$$

where $V_{SAT\_IN}$ represents a lower saturation voltage of audio input signal $V_{IN}$ which may be related to a lower saturation voltage of a power converter implemented by first control loop 26, as described in greater detail below.

Figure 4:
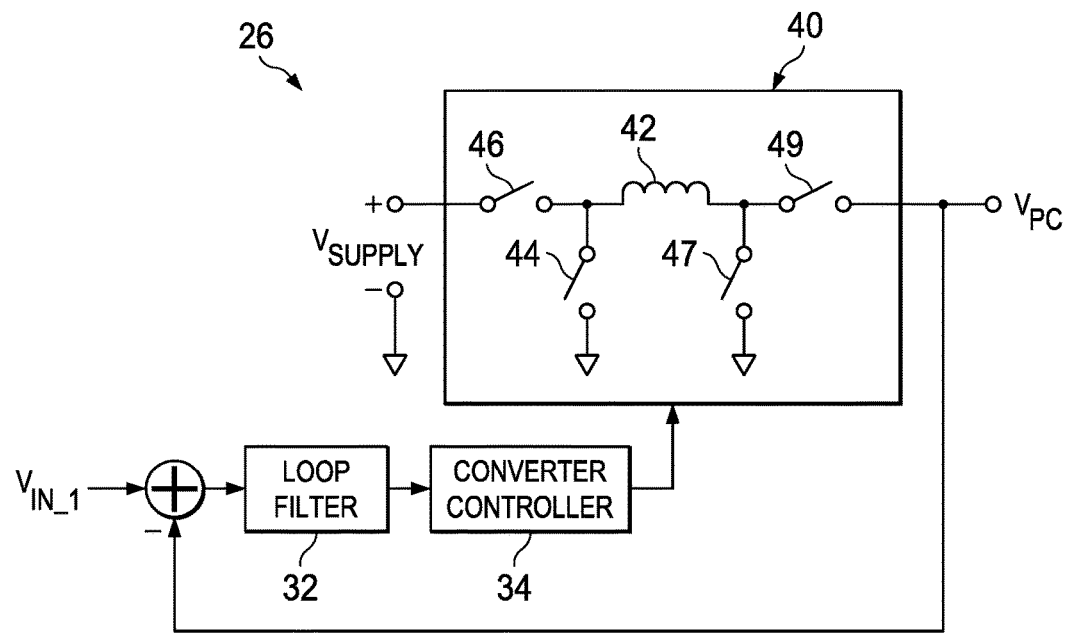
FIG. 4 illustrates a circuit diagram of selected components of an example control loop that may be used to implement the first control loop depicted in FIG. 3, in accordance with embodiments of the present disclosure.

First control loop 26 may receive first signal $V_{IN\_1}$ at its input and may generate at its output a voltage $V_{PC}$ as a function of first signal $V_{IN\_1}$. Turning briefly to FIG. 4, FIG. 4 illustrates a circuit diagram of selected components of an example control loop 26 that may be used to implement first control loop 26 depicted in FIG. 3, in accordance with embodiments of the present disclosure. As shown in FIG. 4, first control loop 26 may comprise a loop filter 32 and a power converter 40.

Loop filter 32 may comprise any system, device, or apparatus configured to receive an input signal (e.g., first signal $V_{IN\_1}$ or a derivative thereof) and a feedback signal (e.g., voltage $V_{PC}$, a derivative thereof, or other signal indicative of signal $V_{PC}$) and based on such input signal and feedback signal, generate a controller input signal to be communicated to converter controller 34. In some embodiments, such controller input signal may comprise a signal indicative of an integrated error between the input signal and the feedback signal. In other embodiments, such controller input signal may comprise a signal indicative of a target voltage signal to be driven as voltage $V_{PC}$ or a target current signal to be driven by power converter 40.

Converter controller 34 may comprise any system, device, or apparatus configured to, based on an input signal (e.g., output signal of loop filter 32), voltage $V_{PC}$, and/or other characteristics of first control loop 26, control switching of switches integral to power converter 40, in order to cause first control loop 26 to generate voltage $V_{PC}$ as a function of first signal $V_{IN\_1}$.

As shown in FIG. 4, power converter 40 may include a power inductor 42, and switches 44, 46, 47, and 49 arranged as shown. In some embodiments, a voltage $V_{SUPPLY}$ (e.g., provided by power supply 10 depicted in FIG. 2) may be received via input terminals including a positive input terminal and a negative input terminal which may be coupled to a ground voltage. Accordingly, in operation, converter controller 34 may be configured to control switches 44, 46, 47, and 49 in order to convert voltage $V_{SUPPLY}$ to voltage $V_{PC}$, such that voltage $V_{PC}$ is a function of first signal $V_{IN\_1}$ to loop filter 32.

Turning again to FIG. 3, second control loop 28 may receive at its inputs voltage $V_{PC}$ generated by first control loop 26, second signal $V_{IN\_2}$, and audio input signal $V_{IN}$, and based thereon may generate at its output audio output signal $V_{OUT}$. As described in greater detail in this disclosure (including, without limitation, in reference to FIG. 5, below), second control loop 28 may comprise at least one linear amplifier and, in some embodiments, a plurality of switches, wherein the at least one linear amplifier and the plurality of switches, if present, are controlled by a loop filter in order generate audio output signal $V_{OUT}$ based on voltage $V_{PC}$, second signal $V_{IN\_2}$, and audio input signal $V_{IN}$, such that audio output signal $V_{OUT}$ is a function of audio input signal $V_{IN}$.

Figure 5:
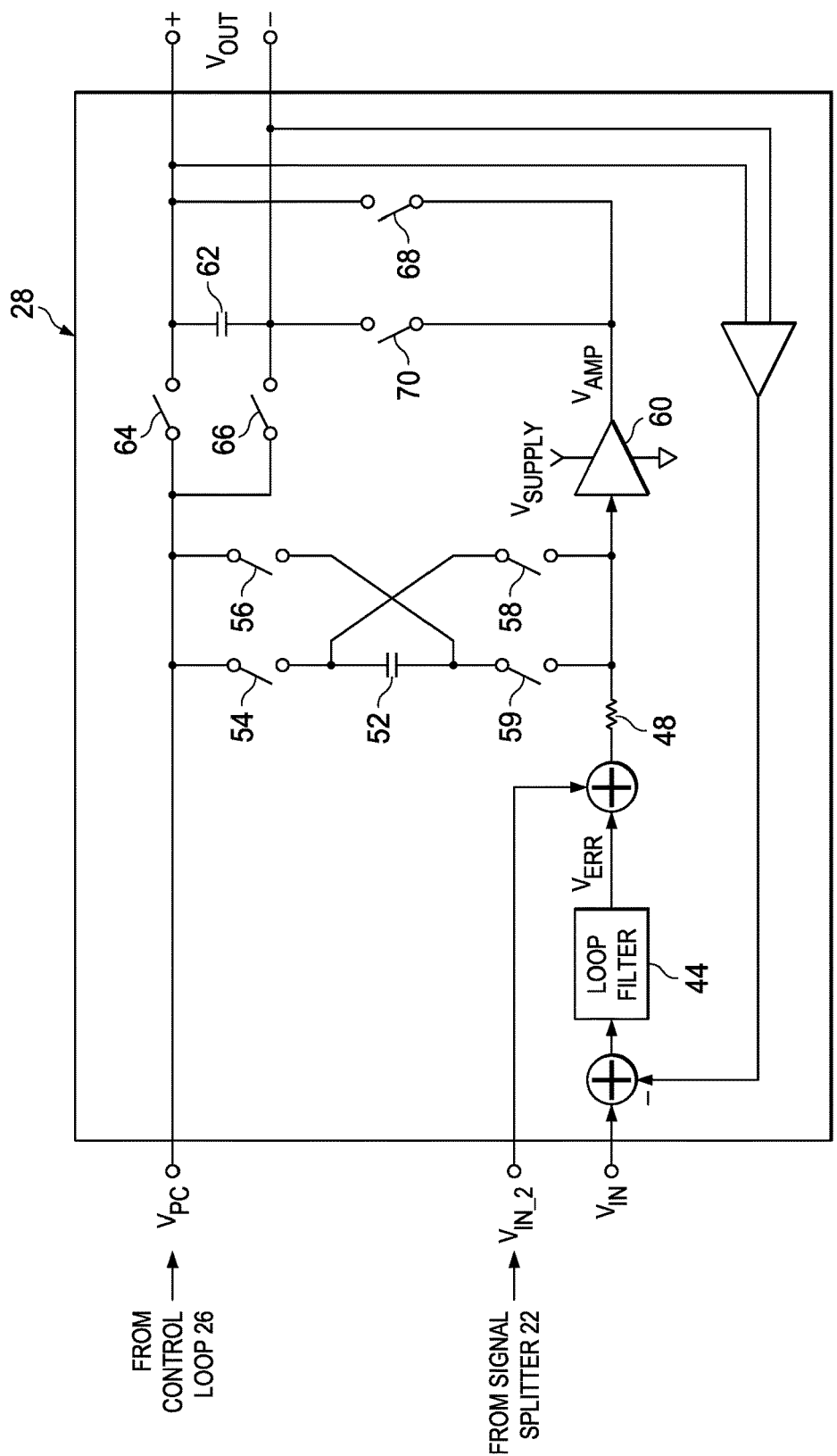
FIG. 5 illustrates a circuit diagram of selected components of an example control loop that may be used to implement the second control loop depicted in FIG. 3, in accordance with embodiments of the present disclosure.

FIG. 5 illustrates a circuit diagram of selected components of an example control loop 28 that may be used to implement second control loop 28 depicted in FIG. 3, in accordance with embodiments of the present disclosure. As shown in FIG. 5, second control loop 28 may comprise a loop filter 44, a linear amplifier 60, an output capacitor 62, a first full-switching bridge comprising switches 64, 66, 68, and 70, a switched capacitor 52, and a second full-switching bridge comprising switches 54, 56, 58, and 59.

Loop filter 44 may comprise any system, device, or apparatus configured to receive an input signal (e.g., audio input signal $V_{IN}$ or a derivative thereof) and a feedback signal (e.g., audio output signal $V_{OUT}$, a derivative thereof, or other signal indicative of audio output signal $V_{OUT}$) and based on such input signal and feedback signal, generate a filtered error signal $V_{ERR}$ to be combined with second signal $V_{IN\_2}$ and communicated to linear amplifier 60. In some embodiments, such filtered error signal $V_{ERR}$ may comprise a signal indicative of an integrated error between the input signal and the feedback signal. In other embodiments, such filtered error signal $V_{ERR}$ may comprise a signal that when combined with second signal $V_{IN\_2}$ is indicative of a target voltage signal to be driven as linear output voltage $V_{AMP}$. In these and other embodiments, loop filter 44 may include control circuitry and may drive control circuitry for controlling switches 54, 56, 58, 59, 64, 66, 68, and 70, in order to cause second control loop 28 to generate audio output signal $V_{OUT}$ as a function of voltage $V_{PC}$ and second signal $V_{IN\_2}$ (and thus a function of audio input signal $V_{IN}$).

As shown in FIG. 5, first control loop 26 may drive voltage $V_{PC}$ which is received by second control loop 28. Accordingly, first control loop 26 may be considered a first processing path configured to process a first signal (e.g., first signal $V_{IN\_1}$) derived from an input signal (e.g., audio input signal $V_{IN}$) to generate a first path voltage ($V_{PC}$) at a first processing path output (e.g., output of first control loop 26).

Switch 64 may be coupled between the output of first control loop 26 and a first load terminal of second control loop 28, and switch 66 may be coupled between the output of first control loop 26 and a second load terminal of second control loop 28. Linear amplifier 60 may be configured to drive a linear amplifier output voltage $V_{AMP}$ which is a function of the filtered error signal $V_{ERR}$ generated by loop filter 44. Switch 68 may be coupled between the output of linear amplifier 60 and the first load terminal of second control loop 28, and switch 70 may be coupled between the output of linear amplifier 60 and the second load terminal of second control loop 28. Output capacitor 62 may be coupled between a first load terminal (e.g., positive terminal of audio output signal $V_{OUT}$) and a second load terminal (e.g., negative terminal of audio output signal $V_{OUT}$). Accordingly, linear amplifier 60 may be considered a second processing path configured to process a second signal (e.g. second signal $V_{IN\_2}$) derived from an input signal (e.g., audio input signal $V_{IN}$) to generate a second path voltage ($V_{AMP}$) at a second processing path output (e.g., output of linear amplifier 60). In addition, the first full-switching bridge may accordingly include a first plurality of switches (e.g., 64 and 66) comprising at least a first switch (e.g., 64) coupled between the first processing path output and a first load terminal, and a second switch (e.g., 66) coupled between the first processing path output and a second load terminal and a second plurality of switches (e.g., 68 and 70) comprising at least a third switch (e.g., 68) coupled between the second processing path output and the first load terminal and a fourth switch (e.g., 70) coupled between the second processing path output and the second load terminal.

In operation of second control loop 28, loop filter 44 or another controller may activate switches 64 and 70 and deactivate switches 66 and 68 for positive values of audio output signal $V_{OUT}$ and activate switches 66 and 68 and deactivate switches 64 and 70 for negative values of audio output signal $V_{OUT}$. Loop filter 44 or such other controller may, as power converter output voltage $V_{PC}$ approaches its lower saturation limit, cause linear amplifier 60 to drive a non-zero linear amplifier output voltage $V_{AMP}$ in order to increase a common mode voltage between the first output terminal and the second output terminal, allowing audio output signal $V_{OUT}$ to approach and cross zero. Above the lower saturation limit of power converter output voltage $V_{PC}$, converter controller 34 may cause linear amplifier 60 to drive an approximately zero linear amplifier output voltage $V_{AMP}$ such that a magnitude of audio output signal $V_{OUT}$ is equal to power converter output voltage $V_{PC}$.

Figure 6:
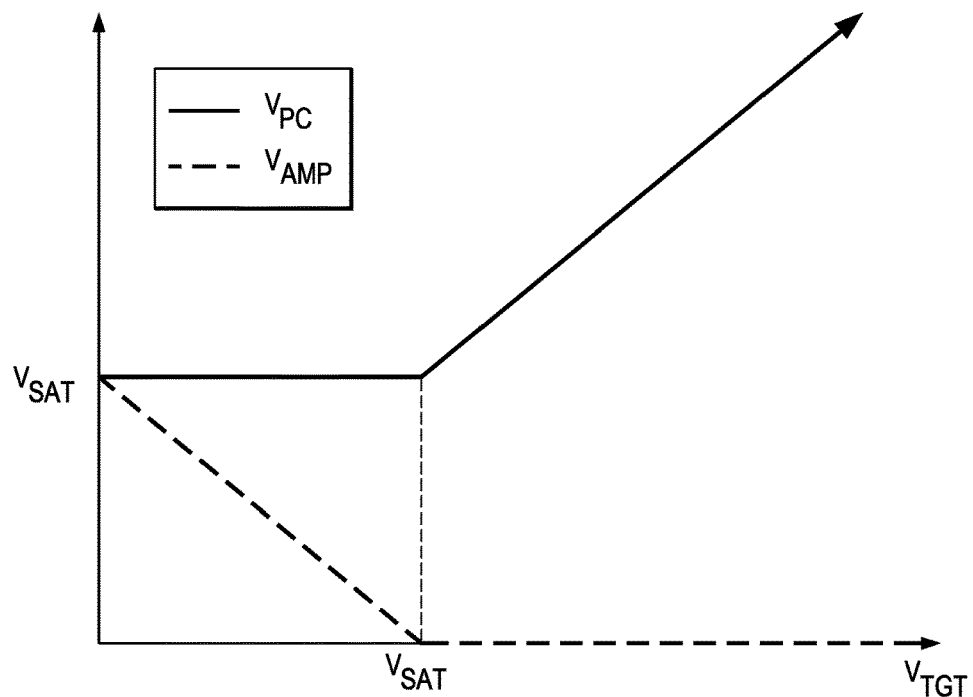
FIG. 6 illustrates a graph depicting the relationship of a voltage driven by the first control loop depicted in FIG. 3 and a voltage driven by a linear amplifier of the output stage depicted in FIG. 3 as a function of a desired output voltage, in accordance with embodiments of the present disclosure.

In other words, first control loop 26 and linear amplifier 60 may be controlled to generate voltages in accordance with the following functions, which are graphically depicted in FIG. 6, and wherein voltage $V_{TGT}$ represents a target or desired voltage to be output as audio output signal $V_{OUT}$:

$$V_{PC}=V_{TGT}; \text{ for } |V_{TGT}|>V_{SAT}$$

$$V_{PC}=V_{SAT}; \text{ for } |V_{TGT}|\leq V_{SAT}$$

$$V_{AMP}=0; \text{ for } |V_{TGT}|>V_{SAT}$$

$$V_{AMP}=V_{SAT}-V_{TGT}; \text{ for } |V_{TGT}|\leq V_{SAT}$$

In some embodiments, an offset voltage may be added to each of the output of first control loop 26 and the output of linear amplifier 60, to ensure that the voltage $V_{AMP}>0$ at all times.

Accordingly, presence of linear amplifier 60 and its ability to increase the common mode voltage of the output terminals in response to low magnitudes of the output signal $V_{OUT}$ may minimize non-linearities of audio output signal $V_{OUT}$ as a function of audio input signal $V_{IN}$, and permit crossing a magnitude of zero by audio output signal $V_{OUT}$.

With respect to the second full-switching bridge, switch 54 may be coupled between the output of first control loop 26 and a first terminal of switching capacitor 52, and switch 56 may be coupled between the output of first control loop 26 and a second terminal of switching capacitor 52. Switch 58 may be coupled between the input of linear amplifier 60 and the first terminal of switching capacitor 52, and switch 59 may be coupled between the input of linear amplifier 60 and the second terminal of switching capacitor 52. Accordingly, the second full-switching bridge may include a third plurality of switches (e.g., 54 and 56) comprising at least a fifth switch (e.g., 54) coupled between the first processing path output (e.g., output of first control loop 26) and a first capacitor terminal and a sixth switch (e.g., 56) coupled between the first processing path output and the second capacitor terminal and a fourth plurality of switches (e.g., 58 and 59) comprising at least a seventh switch (e.g., 58) coupled between a second processing path input (e.g., input of linear amplifier 60) and the first capacitor terminal and an eighth switch (e.g., 59) coupled between the second processing path input and the second capacitor terminal.

In operation of second control loop 28, loop filter 44 or another controller may control switches 54, 56, 58, and 59 of the second switching full-bridge such that when switches 64, 66, 68, and 70 of the first switching full-bridge are switched to reverse connectivity of the output of first control loop 26 and the output of linear amplifier 60 to the first load terminal and the second load terminal as described above, switches 54, 56, 58, and 59 of the second switching full-bridge may be switched substantially contemporaneously with switching of switches 64, 66, 68, and 70 of the first switching full-bridge to reverse connectivity of the output of first control loop 26 and the input of linear amplifier 60 to the terminals of switching capacitor 52 in order to minimize voltage discontinuities caused by the switching of switches 64, 66, 68, and 70 of the first switching full-bridge.

Figure 7:
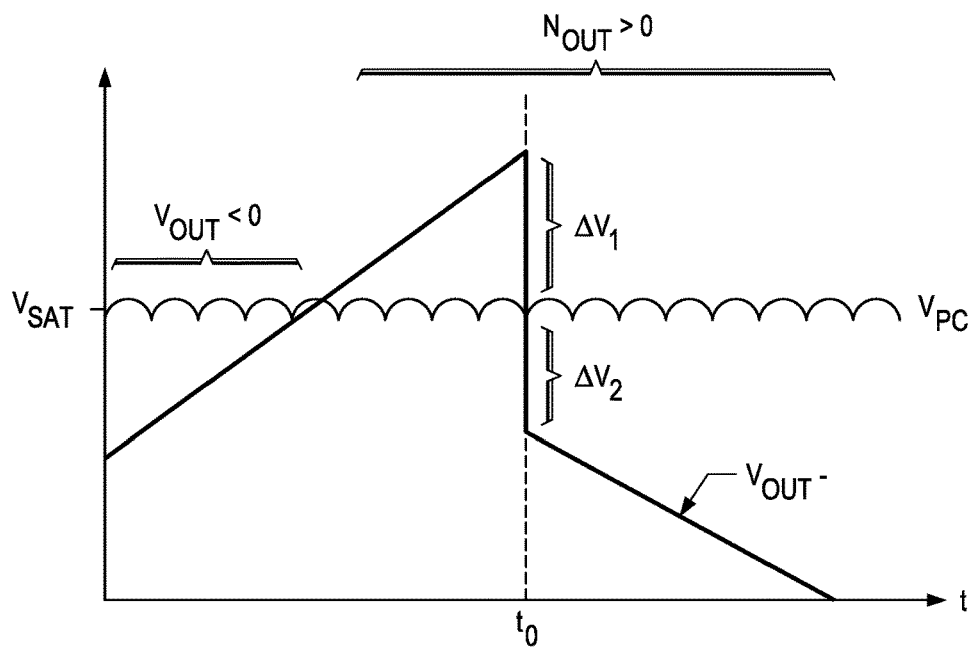
FIG. 7 illustrates a graph depicting the relationship of a voltage driven by the first control loop depicted in FIG. 3 and a voltage driven by a linear amplifier of the output stage depicted in FIG. 3 as a function of time, in accordance with embodiments of the present disclosure.

To further illustrate the effect of such switching, FIG. 7 illustrates a graph depicting the relationship of voltage $V_{PC}$ driven by first control loop 26 and voltage driven by a linear amplifier 60 as a function of time, in accordance with embodiments of the present disclosure. FIG. 7 depicts such signal voltages during a time when a magnitude of audio output signal $V_{OUT}$ is less than the lower saturation value of voltage $V_{PC}$. Accordingly, during such time, first control loop 26 may output voltage $V_{PC}$ having a direct-current value of lower saturation voltage $V_{SAT}$ with a high-frequency ripple component superimposed as shown in FIG. 7. As audio output signal $V_{OUT}$ increases from a negative polarity to cross zero and increase to positive values, the voltage $V_{OUT_-}$ at the negative terminal of the output of second control loop 28 generated by linear amplifier 60 (e.g., voltage $V_{AMP}$ which is passed through switches 68 and 70 depending on states of such switches) may have a waveform as depicted in FIG. 7. As seen in FIG. 7, so that voltage $V_{AMP}$ may maintain a positive value above zero, commutation of the first full-switching bridge of switches 64, 66, 68, and 70 may occur when audio output signal $V_{OUT}$ is non-zero, as shown at time $t_0$ in FIG. 7. When such output polarity transition occurs at non-zero audio output signal $V_{OUT}$, linear amplifier 60 must immediately transition from supplying a voltage that is $\Delta V_1$ greater than output voltage $V_{PC}$ to a voltage that is $\Delta V_2$ lesser than output voltage $V_{PC}$. In order to minimize discontinuity in audio output signal $V_{OUT}$, $\Delta V_1$ must be maintained approximately equal to $\Delta V_2$.

Referring again to FIG. 5, a low-pass filter comprising parasitic resistance 48 and capacitor 52 may create a significant delay path in second control loop 28, such that if the transition of the first full-switching bridge of switches 64, 66, 68, and 70 is driven solely by second control loop 28, the delays imposed by the low-pass filter may now allow for fast resolution of the discontinuity. However, by commutating the second full-switching bridge of switches 54, 56, 58, and 59 substantially contemporaneously with the first full-switching bridge of switches 64, 66, 68, and 70, such delay may be alleviated.

In addition, while switching capacitor 52 and parasitic resistance 48 may effectively form a low-pass filter as seen from the output of loop filter 44, switching capacitor 52 and parasitic resistance 48 may effectively form a high-pass filter as seen from the output of control loop 26. Accordingly, high-frequency components of voltage $V_{PC}$, such as the high-frequency ripple depicted in FIG. 7, may be capacitively coupled into the input of linear amplifier 60, such that the high-frequency components are coupled (e.g., in a feed-forward manner) into the input of linear amplifier 60 and passed to linear amplifier output voltage $V_{AMP}$, such that the high-frequency components of voltage $V_{PC}$ are effectively cancelled out by voltage $V_{AMP}$, and such that the high-frequency components of voltage $V_{PC}$ are substantially absent from the load voltage. Accordingly, the feedback control loop of second control loop 28 may operate predominantly on low-frequency components of voltage $V_{PC}$ and voltage $V_{AMP}$ below a corner frequency of the high-pass filter.

As used herein, a "switch" may comprise any suitable device, system, or apparatus for making a connection in an electric circuit when the switch is enabled (e.g., activated, closed, or on) and breaking the connection when the switch is disabled (e.g., deactivated, open, or off) in response to a control signal received by the switch. For purposes of clarity and exposition, control signals for switches described herein are not depicted although such control signals would be present to selectively enable and disable such switches. In some embodiments, a switch may comprise a metal-oxide-semiconductor field-effect transistor (e.g., an n-type metal-oxide-semiconductor field-effect transistor).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A signal processing system for producing a load voltage at a load output of a switching power stage, the load output comprising a first load terminal having a first load voltage and a second load terminal having a second load voltage such that the load voltage comprises a difference between the first load voltage and the second load voltage, the switching power stage comprising:
    a first processing path configured to process a first signal derived from an input signal to generate a first path voltage at a first processing path output;
    a second processing path configured to process a second signal received at a second processing path input and derived from the input signal to generate a second path voltage at a second processing path output;
    a first switching full-bridge comprising:
        a first plurality of switches, comprising at least a first switch coupled between the first processing path output and the first load terminal and a second switch coupled between the first processing path output and the second load terminal; and
        a second plurality of switches, comprising at least a third switch coupled between the second processing path output and the first load terminal and a fourth switch coupled between the second processing path output and the second load terminal;
    a capacitor having a first capacitor terminal and a second capacitor terminal;
    a second switching full-bridge comprising:
        a third plurality of switches, comprising at least a fifth switch coupled between the first processing path output and the first capacitor terminal and a sixth switch coupled between the first processing path output and the second capacitor terminal; and
        a fourth plurality of switches, comprising at least a seventh switch coupled between the second processing path input and the first capacitor terminal and an eighth switch coupled between the second processing path input and the second capacitor terminal; and
    a controller configured to:
        control switches of the first switching full-bridge in order to generate the load voltage as a function of the input signal; and
        control switches of the second switching full-bridge such that when switches of the first switching full-bridge are switched to reverse connectivity of the first processing path and the second processing path to the first load terminal and the second load terminal, switches of the second switching full-bridge are switched substantially contemporaneously with switching of the switches of the first switching full-bridge to reverse connectivity of the first processing path and the second processing path to the first capacitor terminal and the second capacitor terminal and minimize voltage discontinuities caused by the switching of the switches of the first switching full-bridge.

2. The signal processing system of claim 1, wherein the switches of the first switching full-bridge and switches of the second switching full-bridge are switched at a time in which the load voltage is a substantially non-zero voltage.

3. The signal processing system of claim 1, wherein the capacitor couples high-frequency components of the first path voltage into the second signal, such that such high-frequency components are substantially absent from the load voltage.

4. A method for producing a load voltage at a load output of a signal processing system, the load output comprising a first load terminal having a first load voltage and a second load terminal having a second load voltage such that the load voltage comprises a difference between the first load voltage and the second load voltage, the signal processing system comprising:
    a first processing path configured to process a first signal derived from an input signal to generate a first path voltage at a first processing path output;
    a second processing path configured to process a second signal received at a second processing path input and derived from the input signal to generate a second path voltage at a second processing path output;
    a first switching full-bridge comprising:
        a first plurality of switches, comprising at least a first switch coupled between the first processing path output and the first load terminal and a second switch coupled between the first processing path output and the second load terminal; and a second plurality of switches, comprising at least a third switch coupled between the second processing path output and the first load terminal and a fourth switch coupled between the second processing path output and the second load terminal;
a capacitor having a first capacitor terminal and a second capacitor terminal;
a second switching full-bridge comprising:
a third plurality of switches, comprising at least a fifth switch coupled between the first processing path output and the first capacitor terminal and a sixth switch coupled between the first processing path output and the second capacitor terminal; and
a fourth plurality of switches, comprising at least a seventh switch coupled between the second processing path input and the first capacitor terminal and an eighth switch coupled between the second processing path input and the second capacitor terminal; and
wherein the method comprises:
controlling switches of the first switching full-bridge in order to generate the load voltage as a function of the input signal; and
controlling switches of the second switching full-bridge such that when switches of the first switching full-bridge are switched to reverse connectivity of the first processing path and the second processing path to the first load terminal and the second load terminal, switches of the second switching full-bridge are switched substantially contemporaneously with switching of the switches of the first switching full-bridge to reverse connectivity of the first processing path and the second processing path to the first capacitor terminal and the second capacitor terminal and minimize voltage discontinuities caused by the switching of the switches of the first switching full-bridge.

5. The method of claim 4, wherein the switches of the first switching full-bridge and switches of the second switching full-bridge are switched at a time in which the load voltage is a substantially non-zero voltage.

6. The method of claim 4, wherein the capacitor couples high-frequency components of the first path voltage into the second signal, such that such high-frequency components are substantially absent from the load voltage.

7. A signal processing system for producing a load voltage at a load output of the signal processing system, the load output comprising a first load terminal having a first load voltage and a second load terminal having a second load voltage such that the load voltage comprises a difference between the first load voltage and the second load voltage, the signal processing system comprising:
a first processing path configured to process a first signal derived from an input signal to generate the first load voltage at a first processing path output;
a second processing path configured to process a second signal received at a second processing path input and derived from the input signal, wherein the second signal comprises information of the input signal absent from the first signal, to generate the second load voltage at a second processing path output; and
a high-pass filter coupled between the first processing path output and the second processing path input such that the output of the high-pass filter is combined with the second signal at the second processing path input.

8. The signal processing system of claim 7, wherein the high-pass filter couples high-frequency components of the first load voltage into the second signal, such that such high-frequency components are substantially absent from the load voltage.

9. The signal processing system of claim 7, wherein the second processing path comprises a feedback control loop configured to generate the second load voltage based on the input signal and the load voltage.

10. The signal processing system of claim 9, wherein the high-pass filter feeds forward high-frequency components of the first load voltage into the second signal, such that the feedback control loop operates predominantly on low-frequency components of the first load voltage and the second load voltage below a corner frequency of the high-pass filter.

11. The signal processing system of claim 7, wherein the high-pass filter comprises a capacitor coupled between the first processing path output and the second processing path input.

12. A method for producing a load voltage at a load output of a signal processing system, the load output comprising a first load terminal having a first load voltage and a second load terminal having a second load voltage such that the load voltage comprises a difference between the first load voltage and the second load voltage, comprising:
processing a first signal derived from an input signal to generate the first load voltage at a first processing path output;
processing a second signal received at a second processing path input and derived from the input signal, wherein the second signal comprises information of the input signal absent from the first signal, to generate the second load voltage at a second processing path output; and
high-pass filtering the first load voltage and combining a result of the high-pass filtering with the second signal at the second processing path input.

13. The method of claim 12, wherein high-pass filtering comprises coupling high-frequency components of the first load voltage into the second signal, such that such high-frequency components are substantially absent from the load voltage.

14. The method of claim 12, wherein the second processing path comprises a feedback control loop configured to generate the second load voltage based on the input signal and the load voltage.

15. The method of claim 14, wherein the high-pass filtering is performed by a high-pass filter, and the method further comprises feeding forward with the high-pass filter high-frequency components of the first load voltage into the second signal, such that the feedback control loop operates predominantly on low-frequency components of the first load voltage and the second load voltage below a corner frequency of the high-pass filter.

16. The method of claim 12, wherein the high-pass filtering is performed by a high-pass filter and the high-pass filter comprises a capacitor coupled between the first processing path output and the second processing path input.

* * * * *